US011024620B2

United States Patent
Aton et al.

(10) Patent No.: US 11,024,620 B2
(45) Date of Patent: Jun. 1, 2021

(54) INTEGRATED CIRCUITS AND PROCESSES FOR PROTECTION OF STANDARD CELL PERFORMANCE FROM CONTEXT EFFECTS

(71) Applicant: Texas Instruments Incorporated, Dallas, TX (US)

(72) Inventors: Thomas J. Aton, Dallas, TX (US); Roger Mark Terry, Allen, TX (US); Robert L. Pitts, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/052,770

(22) Filed: Aug. 2, 2018

(65) Prior Publication Data

US 2018/0342494 A1    Nov. 29, 2018

Related U.S. Application Data

(62) Division of application No. 13/454,801, filed on Apr. 24, 2012, now Pat. No. 10,192,859.

(Continued)

(51) Int. Cl.
| | | |
|---|---|---|
| *H01L 27/118* | (2006.01) | |
| *H01L 27/02* | (2006.01) | |
| *G06F 30/39* | (2020.01) | |

(52) U.S. Cl.
CPC .......... *H01L 27/0207* (2013.01); *G06F 30/39* (2020.01); *H01L 27/0251* (2013.01); *H01L 27/0296* (2013.01); *H01L 27/11803* (2013.01)

(58) Field of Classification Search
CPC ............ H01L 27/0207; H01L 27/0296; H01L 27/0251; H01L 27/11803; G06F 17/5068
See application file for complete search history.

(56) References Cited

U.S. PATENT DOCUMENTS 6,560,753 B2   5/2003   Barney et al.
7,442,597 B2   10/2008  Tsui et al.
(Continued)

OTHER PUBLICATIONS

Aikawa, H., et al. Variability Aware Modeling and Characterization in Standard Cell in 45nm CMOS with Stress Enhancement Technique. Proc. 2008 VLSI Technology Symposium, 90-91 (2008). FIGS. 2(b), 6.

(Continued)

*Primary Examiner* — Ismail A Muse
(74) *Attorney, Agent, or Firm* — Ray A. King; Charles A. Brill; Frank D. Cimino

(57) ABSTRACT

Integrated circuit (5) includes substrate (10) with surface (20) and structure (30) including base levels (45.*i*, 45.(*i*+1)), terminating cells (48, 49), and block (40) of standard cells arranged in rows (42.*i*, 42.(*i*+1)), and another type of block (60) outside block (40). Standard cells at at least two edges of block (40) have the following protections: (1) block (60) has strip of separation (41.*j*) having at least a minimum width from the edges of block (40), and protected by one of the following: (2) terminating cells (48, 49) reduce context effect and some terminating cells (48) are placed at at least one end of rows (42.*i*, 42.(*i*+1)) of standard cells within first-named block (40), and (3) the terminating cells (48, 49) reduce context effect and some terminating cells (49) are at one end of a column of standard cells within block (40). Other structures, devices, and processes are also disclosed.

14 Claims, 7 Drawing Sheets

Related U.S. Application Data

(60) Provisional application No. 61/484,767, filed on May 11, 2011.

(56) References Cited

U.S. PATENT DOCUMENTS

| | | | |
|---|---|---|---|
| 7,458,051 | B2 | 11/2008 | Hou et al. |
| 7,709,301 | B2 | 5/2010 | Bosshart |
| 2006/0080632 | A1 | 4/2006 | Ng et al. |
| 2007/0099314 | A1 | 5/2007 | Chen et al. |
| 2009/0033368 | A1 | 2/2009 | Pitts |
| 2009/0113368 | A1 | 4/2009 | Lin et al. |
| 2009/0168843 | A1 | 7/2009 | Waters et al. |
| 2009/0175081 | A1* | 7/2009 | Kim ............ G11C 16/0483 365/185.11 |
| 2009/0321791 | A1 | 12/2009 | Wagner |
| 2010/0058267 | A1 | 3/2010 | Lu et al. |
| 2010/0163948 | A1 | 7/2010 | Bosshart |
| 2010/0218158 | A1 | 8/2010 | Chow et al. |
| 2010/0258798 | A1 | 10/2010 | Sokel et al. |
| 2010/0269081 | A1 | 10/2010 | Hou et al. |
| 2010/0275167 | A1 | 10/2010 | Fu et al. |
| 2010/0289111 | A1 | 11/2010 | Lee et al. |
| 2011/0033787 | A1 | 2/2011 | Lin et al. |
| 2011/0078639 | A1 | 3/2011 | Lin et al. |
| 2011/0151359 | A1 | 6/2011 | Shieh et al. |
| 2011/0167396 | A1 | 7/2011 | Riviere-Cazaux |
| 2011/0177658 | A1 | 7/2011 | Law et al. |

OTHER PUBLICATIONS

Bingert, R., et al. Implementation of silicon-validated variability analysis and optimization for standard cell libraries. in Design for Manufacturability through Design-Process Integration II, Singh, V.K. et al. eds. Proc. SPIE 6925, 69250M (2008). 12pp. FIGS. 6, 8, 9. pp. 1, 11.

Gu, A., et al. Lossless Compression Algorithms for Post-OPC IC Layout, IEEE Int'l Conf. Image Processing, ICIP 2007. vol. 2, pp. II-357 II-360, Sep. 16, 2007-Oct. 19, 2007. http://ieeexplore.ieee.org/stamp/stamp.jsp?tp=&arnumber=4379166&isnumber=4379065 FIGS. 1-2.

Kahng, A., et al. Chip Optimization Through STI Stress—Aware Placement Perturbations and Fill Insertion. IEEE Transactions on Computer-aided Design of Integrated Circuits and Systems—TCAD, vol. 27, No. 7, 2008, pp. 1241-1252, FIGS. 1, 3, 8-13.

Lu, Z., et al. Challenges and Solutions for Trench Lithography beyond 65nm Node. Design and Process Integration for Microelectronic Manufacturing IV. Wong, A., et al. eds. Proc. SPIE, vol. 6156, 615617 (2006). 11pp., FIGS. 3, 7, 11-13.

Rajagopal, A., et al. Context analysis and validation of lithography induced systematic variations in 65nm designs. in Design for Manufacturability through Design-Process Integration II, Singh, V.K. et al. eds. Proc. SPIE vol. 6925, 69250A-1-8, (2008). FIGS. 4, 8b. pp. 1, 8.

Sadra, K., et al. Variations in timing and leakage power of 45nm library cells due to lithography and stress effects. Proc. SPIE, vol. 7275_21, (2009). 10pp., FIGS. 3-4, 16-20; p. 10.

Verghese, N., et al. Modeling Stress—Induced Variability Optimizes IC Timing Performance. White Paper 21355 0310 RG/DM/PDF. Cadence Design Systems, San Jose, CA. 2010. 10 pp., FIGS. 1-7.

Yong Ai-Ling et al. Proximity Handling for Design Block Using StarRC Parasitic Extraction. Altera. Aug. 2010. 24pp., http://www.altera.com/literature/cp/cp-01072-starrc-parasitic.pdf, FIGS. 3-8, Sec. 3.2.4.

Kasthuri, B., et al. Variation-Aware Design Flow for 45nm and below using Electrical DFM. CDNLive 2009. 15 slides selected out of 43pp. http://www.cadence.com/cdnlive/library/Documents/2009/NA/100909—Track 1-3—Nishath Verghese—Cadence_Final.pdf . Slides 1-2, 6-10, 25-31, 35.

Sadra, K., et al. Variability Analysis of a Standard-Cell Library in a 28nm Technology Using Early DFM Models. CDNLive 2009. 8pp selected out of 46pp: Slides 1-2, 7-8, 40-42, 44. http://www.cadence.com/cdnlive/library/Documents/2009/NA/101209%20-%20Track2-3%20-%20Kayvan%20Sadra%20-%20Texas%20Instruments_Final.pdf . Slides 7-8, 40-42, 44.

* cited by examiner

INTEGRATED CIRCUITS AND PROCESSES FOR PROTECTION OF STANDARD CELL PERFORMANCE FROM CONTEXT EFFECTS

CROSS-REFERENCE TO RELATED APPLICATIONS

This application is a divisional of U.S. Nonprovisional patent application Ser. No. 13/454,801, filed Apr. 24, 2012, which claims the benefit of U.S. Provisional Application Ser. No. 61/484,767, filed May 11, 2011, the contents of both of which are herein incorporated by reference in its entirety.

This application is related to U.S. Pat. No. 7,709,301 of Texas Instruments Incorporated, dated May 4, 2010, and which is incorporated herein by reference in its entirety for some background.

STATEMENT REGARDING FEDERALLY SPONSORED RESEARCH OR DEVELOPMENT

Not applicable.

FIELD OF THE INVENTION

The field of the invention includes electronic integrated circuits and integrated circuit substructures, and processes of manufacturing integrated circuits. Among other integrated circuits, various integrated circuits such as analog and mixed signal circuits, digital circuits, wireless circuits, application specific integrated circuits (ASICs), etc., can benefit from the embodiments.

BACKGROUND

The fields of technology include integrated circuit structures and processes for making them.

Processes of making integrated circuit structures have line widths of microscopic dimensions currently measured in nanometers (nm). Process generations having different size line widths from each other are called process nodes. An integrated circuit or "chip" generally has a semiconductor substrate (e.g. silicon, silicon germanium or gallium arsenide or other substance), or instead may have an insulating layer, on which semiconductor devices like transistors and diodes are fabricated. Over the semiconductor devices, alternating layers of insulator and conductor are provided, like a layer cake on a cake pan. The conductor layers are patterned and etched into microscopic conducting lines (sometimes called wires and that may have rectangular cross-sections) that are analogous to, but extremely small compared with, say, ordinary electrical conducting wires having a round cross-section as used for home wiring.

The conducting lines are used to interconnect the semiconductor devices to make integrated circuits of varying complexity that under a microscope look like a grid of streets, except at many levels. The conductor layers often are metal but any electrical conductive substance can be useful. One example is polysilicon (poly) which is made conductive for transistor gates and interconnect to the gates. Metal layers for wires are often provided above the poly interconnect layer and interlayer dielectric ILD separates the various layers. Conductive studs called vias are made or deposited through one or more of the ILD layers to electrically connect the conductor layers. Conductive studs are called contacts when they connect the conducting lines at a lower level through dielectric called PMD to integrated semiconductor devices.

To actually implement a particular desired electronic circuit that has been designed and defined by a netlist of the functional electronic circuits, a form of computer software and system is used, called a layout tool or place-and-route tool or simply a tool. The tool situates and defines the geometric arrangement of the transistors, conducting lines, contacts, vias and their interconnections with the semiconductor devices. Tools have constraints, called design rules, that are consistent with the process capabilities and also provide some simplification or order for mathematical algorithms or procedures adopted in a tool to lay out a given complicated integrated circuit and avoid what would otherwise a stupefying and unnecessarily complicated array of geometric possibilities in three dimensions of height, width and depth for the conducting lines that the tool is to define. Structures, placements or geometries that do not conform with design rules are forbidden, and sometimes called "illegal" in the technological sense used in this art.

Newer technologies at advanced semiconductor wafer fabrication process nodes have strong "context effects" where the performance of a transistor depends significantly on what other base layer objects occur near the transistors. Among such base layer objects can be a well beneath transistors (e.g., NWELL), active circuit structures named ACTIVE, Dual Stress Liner (DSL) boundaries of liner over transistors, and length of diffusion LOD from transistor to isolation. Use of standard cells (circuit layout objects) may be difficult in such a technology because each placement of any given cell may have performance that varies with placement and is complicated to estimate because of these context effects.

Context effects have previously generally been "margined for" by accepting an overall degradation in the performance of all of the standard cells. Or they have simply been ignored, detrimentally.

Accordingly, significant departures and alternatives in structures, circuits, processes of manufacture, and processes of design, for addressing the above considerations and problems would be most desirable.

SUMMARY OF THE INVENTION

Generally, various remarkable integrated circuit structures, devices, and processes of manufacture, and processes of design are disclosed and claimed, all as described herein.

In general, and in one form of the invention, an integrated circuit includes a substrate having a semiconducting surface; and a structure formed in and on the semiconducting surface, the structure including base levels, terminating cells, and at least one block of standard cells arranged in a plurality of rows, and at least one other type of block outside the first named block; wherein the standard cells at at least two of the edges of the first-named block are protected by the following protections: (1) the at least one other type of block is separated by a strip of separation having at least a minimum width from the edges of the first-named block, and at least one of the following protections is provided wherein (2) the terminating cells have a context-effect-reducing characteristic and at least some of the terminating cells are placed at at least one end of rows of standard cells within the first-named block, (3) the terminating cells have a context-effect-reducing characteristic and at least some of the terminating cells are placed at at least one end of a column of standard cells within the first-named block.

In general, and in an electronic design process of designing integrated circuits, the process includes storing cells that are divided into classes including a first class of cells that can be placed near other cells in the first class without significant context effects, and a second class of cells that pose more significant context effects for the first class of cells; utilizing selections of cells from the first class of cells in situating such cells near other such first class cells to realize at least part of a design; placing selections of cells from the second class of cells into separate place and route regions; and buffering at least some of the second class cells thus placed so that they are buffered for context effects reduction from the cells of the first-class and the buffering includes providing a cell-block separation strip having at least a minimum width.

In general, and in a process of manufacturing integrated circuits, the process includes fabricating first sets of cells from a first class of standard cells including and near other such standard cells onto a semiconductor substrate to realize at least part of circuitry for an integrated circuit, concurrently fabricating second sets of cells from a second class of cells into regions separate relative to the first sets of cells broadside on the substrate, and concurrently fabricating buffering structures for at least some of the first sets of cells so that they are buffered for context effects reduction from the cells of the second-class.

Other structures, devices, and processes are also disclosed.

Figure 1:
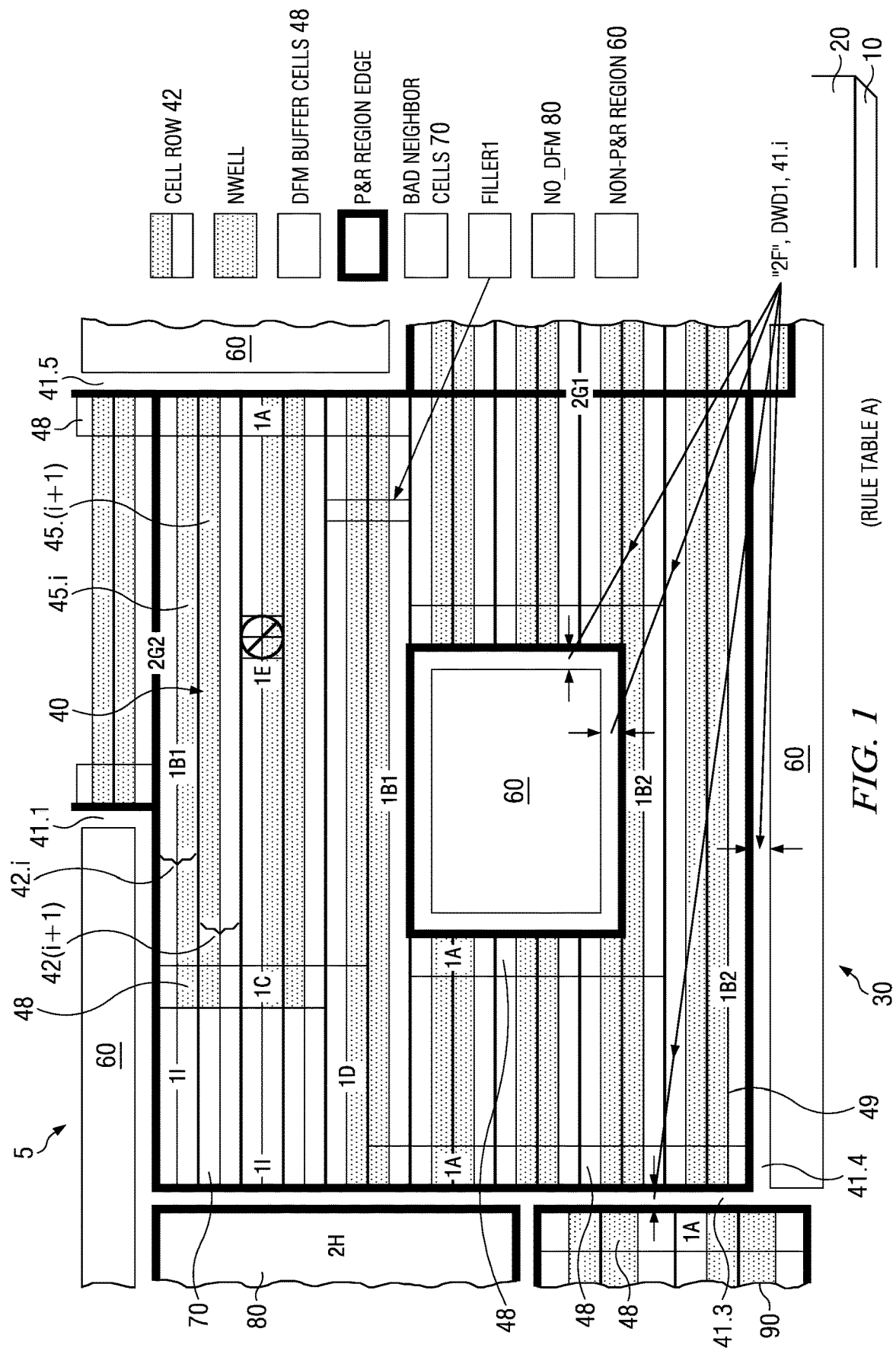
FIG. 1 is a layout diagram of an embodiment having areas legended with different types of cells, blocks of cells and regions, and various rules from RULE TABLE A are enumerated directly on the layout.

Corresponding numerals or designators in different Figures indicate corresponding parts except where the context indicates otherwise. A minor variation in capitalization or punctuation for the same thing does not necessarily indicate a different thing. A suffix .i or .j refers to any of several numerically suffixed elements having the same prefix.

DETAILED DESCRIPTION OF EMBODIMENTS

Some process embodiments herein minimize this hitherto-encountered undesirable performance variation for the vast majority of cells so that good estimates of timing performance can be achieved. The process embodiments both protect the performance of the vast majority of cells from other cells that may generate strong context effects within the Place and Route (P&R) blocks and from other base layer objects (or lack thereof) that may occur near the edges of P&R blocks.

Some of the embodiments solve these and other problems in the following ways, among others. Cells are divided into classes. Those cells that can be placed near other cells without disrupting their neighbor's behavior are called "good neighbors" and can be utilized near other cells in the conventional manner. Cells that disrupt their neighbor's timing beyond certain criteria are declared "bad neighbors" and are segregated or allocated into separate place and route regions and "buffered" from the other standard cells in the sense of context effects reduction. This buffering is accomplished by a third class of cells that cause little, if any, timing disruption and also themselves are insensitive to timing disruption (some types of capacitor cells for example).

Cells near the edges of the P&R blocks are protected from geometries outside the P&R blocks by some combination of one or more of (1) consistently providing cell block separation strips for spacings at least as much as specified dimension(s) near the edges of the P&R blocks to keep other geometries or structures away from the blocks, (2) consistently employing terminating cells of specified characteristics that are placed to cover ends of rows and/or columns of standard cells within the place and route blocks or (3) constraining geometries on certain base levels associated with the context effects to meet dimension rules pertaining to type or amount of permitted overlap or prohibiting specified overlap.

Certain other placements (e.g., side-by-side placements of nearly empty cells, having nearly empty cells on both sides of a cell or on both sides of "narrow" cells) are completely forbidden because of their bad characteristics, at least for some embodiments.

Small blocks that are exceptions to the above rules are allowed when obeying them would use excessive area. In such cases, the designer should make sure that the cells are tested (or retested) to perform satisfactorily in their designed context and such small blocks are marked for the tool or otherwise in a manner to record that the designer has verified their behavior in this context.

Some benefits and advantages of the embodiments are: The cells are much more likely to see a predictable context that has been comprehended when their library timing information is generated according to the way, or as, they were designed. Hence, timing is more realistic and real silicon behavior can be expected to more closely match designed behavior. Having a predictable context can also prevent catastrophic failures in timing estimates where such failures mean that a design fails to function at required speeds.

Some process and embodiments and structure embodiments are represented by a first category of remarkable place and route (P&R) design rules for manufacturing (DFM) described next in connection with RULE TABLE A and its supporting TABLES 1-4.

In FIG. 1, a layout of a Category 1 embodiment has areas legended with the different types of cells and regions. Various rules from RULE TABLE A are enumerated directly on the layout. In this way, the layout shows examples of structure embodiment and the process embodiment rules that produce, constrain, and/or define the structures.

An integrated circuit 5 includes a substrate 10 having a semiconducting surface 20, which surface is, e.g., the surface of substrate 10 itself or the surface of a semiconductor-on-insulator on the substrate 10, or otherwise. A structure 30 is formed in and on the surface 20, and the structure 30 has base levels 45.*i*, 45.*i*+1, terminating cells 48, 49, and at least one block 40 of standard cells arranged in a plurality of rows 42.*i*, 42.*i*+1, and at least one other type of block 60 outside the first named block 40.

Track T terminology: It is believed that industry usage of words and phrases like "track," "track width" and "track pitch" has become familiar to the skilled worker and has evolved somewhat as integrated circuit design has reached more advanced process nodes such as 45 nm and 28 nm. Some guides to meanings are listed next:

i) A number of metal lines (e.g. Metal 2 layer) are generally disposed horizontally across a row of cells, and this number can be used to signify a designation, such as "8-track" library cells. A "track width" dimension e.g. in nanometers refers to a predetermined minimum center-to-center distance between the metal lines, also called metal pitch. The height of a cell is believed customarily described in terms of the number of track widths (metal pitches), or "tracks" for short.

ii) Cells of different widths may be laid out horizontally to form a row of the cells. The width of cells (e.g. 8, 16, or some other number of tracks) was at earlier nodes also customarily described in terms of the number of track widths (metal pitches of vertical metal traces e.g. Metal 3 layer), or "tracks" for short. Then at nodes such as 45 nm and 28 nm such as with poly, it is believed that using a "minimum contacted pitch" related to transistor width has become increasingly a frequent way, or a more frequently-used way, to describe the width of cells. "Track width," "track pitch," and "track" have thus also become associated with descriptions of width in units of minimum contacted pitch or gate pitch and not necessarily metal pitch.

iii) Also it is believed that a usage has arisen wherein the word "track" may be used when referring to a whole row of cells. It is suggested that the interpretation of the description herein should generally look to the applicable one of meanings (i) or (ii) above instead, unless meaning (iii) is clearly intended by a given description sentence herein.

Other terminology: GDS (Graphical Data System) is a conventional format for layout data for pattern generation or tapeout to control integrated circuit wafer manufacturing. "Termination" refers to providing and/or spatially protecting the exterior of the layout of a region as viewed broadside to surface 20 of substrate 10. "Poly" refers to polysilicon. The long dimension of a row of integrated circuit cells is referred to as horizontal. "Width" is measured in the horizontal direction. The "vertical" direction lies in the plane of the layout and perpendicular to the horizontal direction, and "height" is measured in the vertical direction. Vertical and horizontal directions pertain to the layout itself viewed broadside and are independent of a depth direction into substrate. "Column" can refer to a generally vertical direction and disposition of cells even when the cell widths vertically may vary a good deal. "Active" refers to most functional circuitry in general, having active elements like transistors. "Tap" cells have well and substrate tap structures for connection of well and substrate to power and ground conductors. "Decap" or DCAP cells are decoupling capacitor cells provided on-chip to reduce power supply noise (where noise refers to undesired power supply electrical voltage variations). Passive decap and/or active decap cells, or both types, are used as appropriate. A "Filler" or "Fill" cell is a cell having a well such as Nwell and having power and ground conductors but otherwise lacking in passive or active circuit structure. "Dummy" refers to an unconnected structure. An "ECO" cell is any of a number of spare cells or dummy cells that are included in the IC so that revision or rerouting according to an engineering change order (ECO) can connect up particular ones of such spare cells to the functional circuitry to obtain, or tune the chip to, desired performances such as timing, IR drops, etc. (An IR drop is a voltage drop between points in a circuit due to flow of an electric current I through a resistance R between such points.) Asterisk "*" refers to arithmetic multiplication.

Rule Table A:
Section/Rule # Description
Rule 1—Standard Logic Cell Region Rules
P&R Region Termination This section provides that Standard Logic Cells (see TABLE A3) are terminated in such a way that any active circuits are protected within that region, and achieve independence from context effects by any neighboring cell environment. Standard cell logic circuitry is herein protected within each larger region or block area like region or block 40, by using protective border strips or zones 41.*j* having uniform width or minimum width dimension DWD1, also called cell-block separation strips or strips of separation herein. The larger block area 40 itself can then be terminated by row terminating cells 48 and column terminating cells 49 without context consideration of neighboring circuitry in regions or blocks 60, 70, 80, 90 outside of the larger block 40 area. Circuitry 60 is a non-P&R region. Circuitry 70 is a bad neighbor cell region. Circuitry 80 is a NODFM region. Circuitry 90 is a standard cell block or region like block 40 but not aligned with block 40, or circuitry 90 is otherwise problematic from a context-effects viewpoint with respect to block 40.

1A. Left/Right (within row): All Standard Logic Cells within eight tracks (8 T) of the edge of a standard cell region are terminated by some combination of Buffer Cells (see TABLE A1) that is at least 8 T wide. Overlapping poly PO layer and dummy poly layer SRDPO: Overlapping PO and SRDPO conflicts at cell edges produced by the placement of Buffer Cells next to standard logic cells are handled as follows: 1) PO (poly) geometries that cross the P&R boundary layer are identified and arranged to occur at the end of a row of cells or at a gap in a row of cells. 2) These geometries are moved from poly layer to the SRDPO layer.

1B. Top/Bottom (row to row):
      EITHER (1B1) The top and the bottom of Standard Logic Cell (See TABLE A3) rows is terminated on nMOS,
      OR (1B2) If terminated on pMOS then an extra row composed entirely of Buffer Cells (TABLE A1) is added as a buffer row.

Periphery of larger block areas:
   1I. Any type of cell other than standard logic cells may be placed at the edges of larger block areas containing P&R regions.

Bad Neighbor Cell Buffer

This section applies to bad neighbor cells (see TABLE A2) placed within larger block areas containing standard logic cell regions.

1C. Left/Right (within row): Bad neighbors are horizontally separated from Base Levels (See TABLE A4) of Standard Logic Cells (See TABLE A3) by >=DSH nm (square corner) using a design separation-horizontal dimension DSH.

1D. Top/Bottom (row to row): Bad neighbors are vertically separated from Base Levels (see TABLE A4) of Standard Logic Cells (see TABLE A3) by >=DSV nm (square corner) using a design separation-vertical dimension DSV. Any density requirements of the applicable semiconductor process are conformed with.

1E. Within a row, adjacent placements of a one-track (1 T) filler are avoided and not allowed.

Rule 2—System on Chip (Soc) Standard Cell Region Separation

2F. All standard cell regions are separated both vertically and horizontally from Base Levels (See TABLE A4) of neighboring cells by at least DWD1 nm (square corner). This is an example of a region or block separation strip dimension.

2G1. Exception1—Multiple Standard Logic Cell regions having the same track pitch and with no row-to-row offset may be conjoined, provided Nwell and Pwell regions align exactly. See FIG. 2 conjoined wells and cell regions.

2G2. Exception2—Multiple Standard Logic Cell regions having the same out-facing wells may be conjoined.

2H. GDS Layer (210:5), LAFF-name: NODFM, disables all DFM restrictor rule checking within its boundary. Active circuit performance within that NODFM region is the responsibility of the designer and not the tool. (LAFF is a file format, and the acronym stands for lisp archival file format.)

Note: An example value for dimension DWD1 is suitably in hundreds of nanometers, e.g. 770 nm. In one example DSH=DSV=DWD1=770 nm.

Note: In the TABLES A1-A4 and B1-B4, the phrase "Particular ones as specified" indicates that the skilled worker evaluates available cells of the indicated types for context effects compatibility or incompatibility, context effects buffering, or other applicability at that point of the particular table and assigns them for use in the processes and structures for embodiments as taught herein.

Standard cell regions are desirably structured with the same pitch (feature repeat size) to align exactly with controlled gaps.

TABLE A1

BUFFER CELLS

1. FILL cells: particular ones as specified.
   a. FILL cells generally: particular ones as specified.
   b. End row FILL cells: particular one(s) as specified.
2. TAP cells: particular ones as specified.
3. DECAP cells: particular ones as specified.

TABLE A2

BAD NEIGHBOR CELLS

1. Level shifter cells: particular ones as specified.
2. 1.8 V Oxide EDECAP cells and Filler EDECAP: particular ones as specified.
3. Any cell containing GDS Layer (16:0), LAFF-name: OD_18
4. Switch cells: Any cell containing "SWITCH" in the cell name that is not in the Standard Logic Cells list.

TABLE A3

STANDARD LOGIC CELLS

1. All cells containing working transistors that produce a logic state output. This category does not include tap, filler, and capacitor cells.
2. Switch cells: Most particular ones, or as specified in a list.
3. All ECO cells are according to the following notes.
   i. ECO cells can be connected to produce a logic state output and are treated as Standard Logic Cells.
   ii. ECO cells having possibility of an ESD problem are not used, e.g. cells programmed as junction capacitors.

TABLE A4

BASE LEVELS

1. Nwell
2. Oxide Diffusion OD (all types, n-type, p-type)
3. Dummy Oxide Diffusion DOD
4. SRDOD
5. Poly PO
6. Dummy Poly DPO
7. SRDPO P&R blocks are those blocks resulting from use of a place and route (P&R) tool directly. A Non-P&R block is a block resulting from designer activity or intervention whether or not a place and route tool was used.

Figure 2:
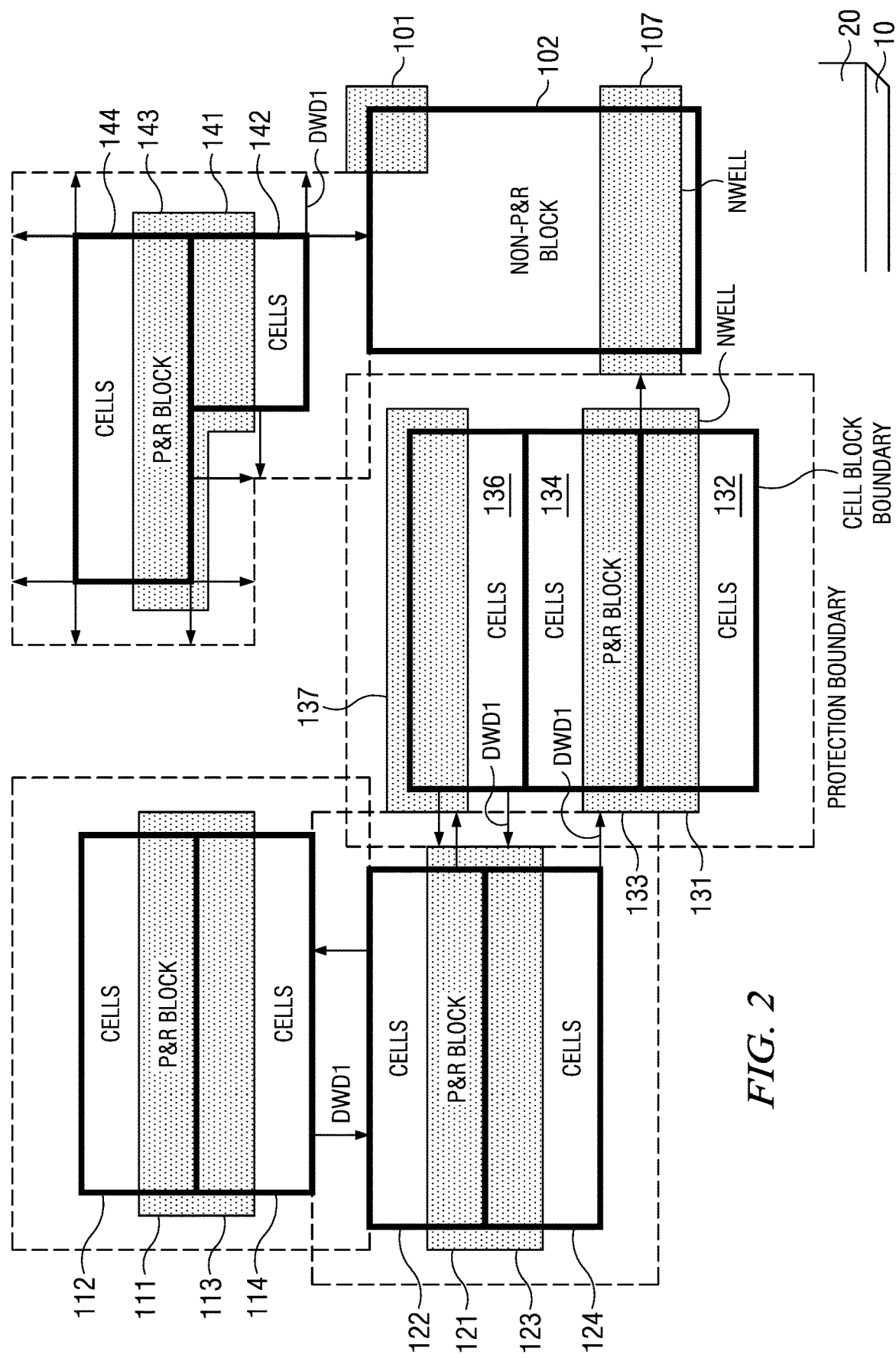
FIG. 2 is a simplified layout of an integrated circuit embodiment to show cells, wells and protective spacing of cells according to a dimension DWD.

In FIG. 2, a simplified layout of a Category 1 embodiment has cells and P&R blocks and non-P&R blocks in and on the surface 20 of substrate 10. Unidirectional dimension-arrows represent protection of cells according to the dimension DWD1. Among other things, FIG. 2 helps illustrate Rule 2F and exceptions 2G1 and 2G2, which have to do with conditions when cells and Nwells can abut one another or be conjoined. Also, when exceptions 2G1 and 2G2 don't apply and protection borders are provided, notice that regions of NWELL underneath may extend somewhat further toward cells and each other in the case of P&R blocks. Otherwise, the protection according to dimension DWD1 of e.g. Rule 2F prevents the Nwell 101 or 107 of a non-P&R block 102 from being placed closer than the protective dimension DWD1 to the cell boundary of a P&R block cell 142 or 132 respectively.

The cell boundaries themselves present the starting lines for protection outward of the cells according to the dimension DWD1 of e.g. Rule 2F. For example, dimension DWD1-H is applied between the left boundary of cells 136 and the right boundary of Nwell 121, 123. Also, dimension DWD1-H is applied between the right boundary of cells 124 and the left boundary of Nwell 133. Structures 121-124 lack horizontal alignment with structures 133-137, and this layout process embodiment applies region or block separation strip dimension DWD1-H to mutually protect structures 121-124 and structures 133-137 from context effects of each on the other, whereby providing a layout structure embodiment. Dimension DWD1-H is also beneficially applied between the right boundary of cells 132 and 134 to the left boundary of Nwell 107.

In FIG. 2, Nwell 111 and cell row 112 are respectively conjoined vertically with Nwell 113 and cell row 114 provided they comply with Rule 2G1. Horizontally, cells in row 112 and cells in row 114 extend in a uniform band free of jogs or offsets. Nwell 111 and Nwell 113 are conjoined vertically since they align exactly and extend in a uniform horizontal band free of jogs or offsets. Similarly, Nwell 121 and cell row 122 are respectively conjoined vertically with Nwell 123 and cell row 124. Similarly also, Nwell 131 and cell row 132 are respectively conjoined vertically with Nwell 133 and cell row 134. Similarly again, Nwell 141 and cell row 142 are respectively conjoined vertically with Nwell 143 and cell row 144 as governed by Rule 2G1 because of perfect vertical alignment upward from the horizontally-shorter structures of Nwell 141 and cell row 142 to the corresponding part of Nwell 143 and cell row 144. Cells 134 and 136 are conjoined vertically provided they comply with Rule 2G2. Note, however, the different situation of cell row 114 and cell row 122. Cell row 114 and cell row 122 are placed a distance DWD1-V vertically apart under Rule 2F because they are not vertically aligned and neither of Rules 2G1 and 2G2 apply.

Notice that the dimension DWD1-V may be, but does not have to be, the same as DWD1-H. These two dimensions DWD1-V and DWD1-H in some embodiments may be established different, such in structures where it is observed that the context effects (e.g. from DSL stress direction) are not the same in the vertical and horizontal directions. In such cases, the dimensions DWD1-V and DWD1-H are determined based on controlling one or more context effects metrics or criteria like percentage departure from a given current or timing as discussed elsewhere herein, except with the determination made independently or with some tradeoffs on metrics for each of these dimensions DWD1-V and DWD1-H respectively.

Figure 3:
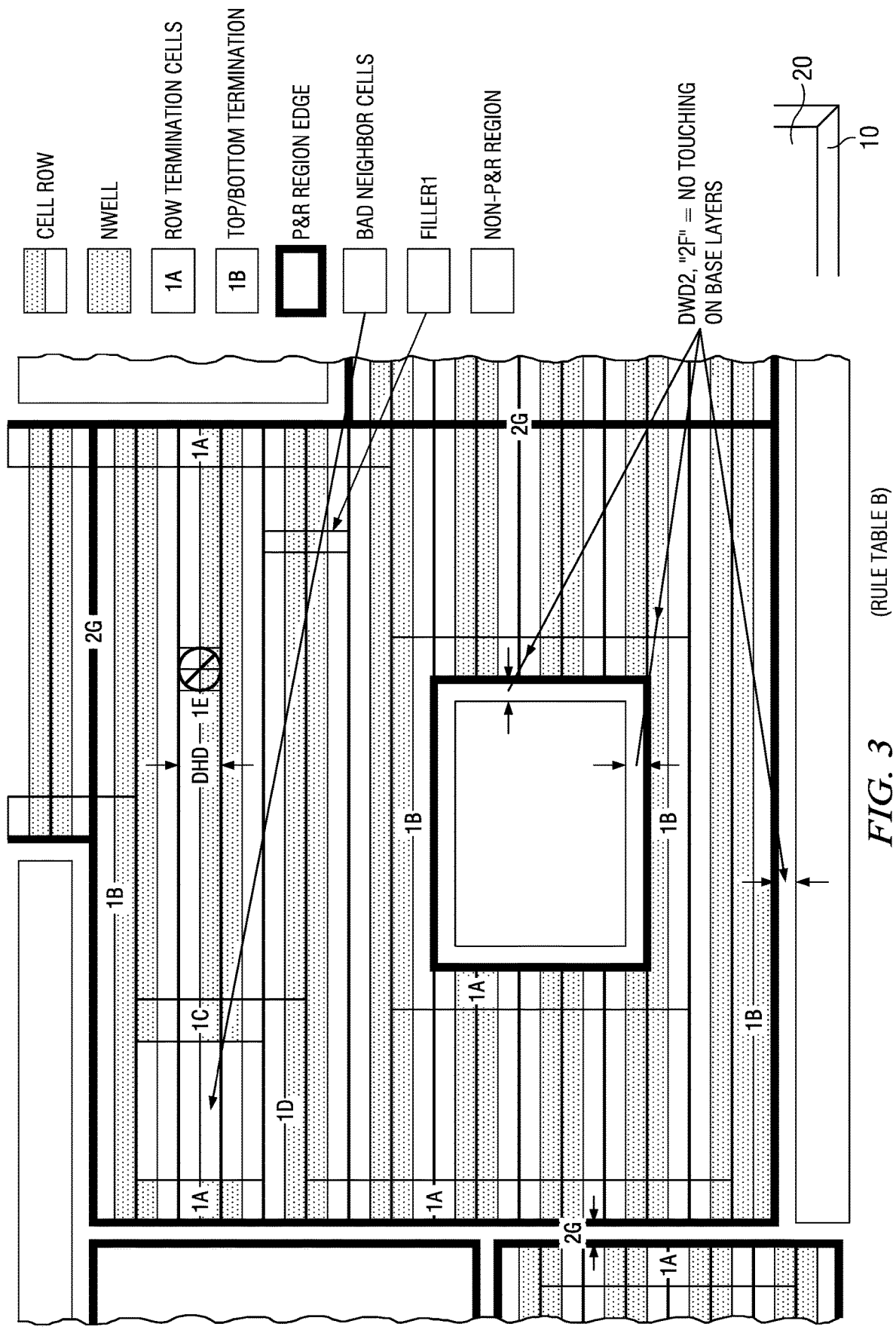
FIG. 3 is a layout diagram of another embodiment having areas legended with different types of cells, blocks of cells and regions, and various rules from RULE TABLE B are enumerated directly on the layout.

Turning to FIG. 3, another structural embodiment includes layout regions shown in layout view. Various portions of the layout are legended with RULE TABLE B rules, with the prefix "B" omitted to promote positioning and clarity of the RULE TABLE B legends. In this way, another category of process embodiments, and structure embodiments such as in FIG. 3 produced with it, are represented by the following design rules of RULE TABLE B and supporting tables. (The layout process of RULE TABLE B protects an integrated circuit fabrication process that is different from another integrated circuit fabrication process protected by the layout process of RULE TABLE A.)

Process and structure embodiments according to these RULE TABLE B rules terminate Standard Cell regions such that any active circuits are protected within that region and operate at or close to their characterization environment, and are substantially independent from context effects coming from the neighboring circuits. In these embodiments, the Standard Cells each have a horizontal boundary width that is an integer multiple of the Minimum Contacted Poly pitch dimension. Specifications of an integer number N of Tracks T means choosing a combination of cells the boundary widths of which add up to the specified integer number of tracks N*T. (Contacted Poly pitch refers to the poly-to-poly distance dimension between poly lines to which contacts are made, e.g., not between dummy poly and contacted poly.)

Rule Table B
Section/Rule # Description
Rule B1—Standard Logic Cell Region Rules
P&R Region Termination This section applies to all boundaries of all blocks of cell library (see TABLE B4) regions. The boundary arrangements help protect the working transistors within a larger block area. The larger block area itself may therefore be placed without further context consideration of neighboring circuitry outside of the larger block area complying with these rules.

B1A. Left/Right within row:

Each row of a standard cell region is terminated on the right and left by some combination of Row Buffer Cells (See TABLE B1) so that their combined track width constitutes a termination region at least 8 T wide. If the combination includes Tap cells, the Tap cells should be along the outside of the block area.

B1B. Top/Bottom (row to row):

The top and the bottom rows of a standard cell region are terminated by a row composed entirely of Top/Bottom Buffer Cells (See TABLE B1).

These top and bottom rows do not have to obey Left/Right Termination Rule B1A as long as any Tap cells at the ends of the rows are no more than 6 T (six Tracks) wide. Tap cells within the row should be above or below other Tap cells.

Note: use the widest possible Top/Bottom Buffer Cells to minimize the number of ACTIVE breaks in these Top/Bottom termination rows.

Bad Neighbor Cell (See Table B2) Buffer

Applies to Bad Neighbor cells placed within (or inside an interior or inner edge of) Standard Cell regions.

B1C. Left/Right (within row)

Bad neighbors are horizontally separated from all other standard cells (except Row Buffer Cells) by at least 8T (eight Tracks) of Row Buffer Cells.

B1D. Bad neighbors are vertically separated from all other standard cells (except Top/Bottom Buffer Cells) by at least one row (1) of Top/Bottom Buffer Cells having single-height DHD.

SiGe Density

B1J. DCAP and TGOX CAP density do not exceed process-specified SiGe density. (DCAP is decoupling capacitor. CAP is capacitor. TGOX is thick gate dielectric, e.g. thick gate oxide.)

Other Rules

B1E. Within rows, keep row free of adjacent placements of 1 T (one Track) filler (filler1), so such placements are absent within each row. Cells containing an effective filler1 at their right or left border (see TABLE B4) should not have a placement of filler1 next to that end.

Rule B2—System on Chip Rules
Standard Cell Region Separation

B2F. All polygons on the Base Levels (See TABLE B3) associated with the Standard Cells do not have any form of touching (overlap, edge, or point) with any Base Level polygon not part of the Standard Cells region.

B2G. All polygons on the Base Levels (See TABLE B3) associated with one Standard Cell region do not have any form of touching (overlap, edge, or point) with any Base Level polygon of any other Standard Cell Region unless the Nwell regions are perfectly aligned horizontally and an Nwell period (e.g. 1260 nm) is exactly maintained vertically (by vertical spatial regularity of Nwells).

Note: RULE TABLE B Dimensioning is indicated as T~=118 nm, for instance. An example value for dimension T is suitably less than two hundred nanometers. T is smaller than DWD1. In some cases T is about 15% or approximately one-seventh of DWD1. Single-height dimension DHD is several times larger than T, e.g. at least five times larger, and for a numerical instance DHD~=630 nm. Nwell period is approximately twice the single-height dimension DHD, e.g., Nwell period~=2*DHD~=1260 nm. An example value for Nwell period is on the order of hundreds or more than a thousand nanometers, or on the order of 10 times T, e.g., in the case of Nwell period~=1260 nm.

A polygon is a closed geometric figure that facilitates specifying design rules and layout software, and the definition of polygon may vary with different layout process embodiments and geometric cases. In the absence of any other particular definition(s) adopted for an embodiment that a polygon definition can facilitate, a polygon is, e.g., a minimum number of shortest connected straight lines forming a closed geometric figure in the plane of layout and enclosing some identified structure or structures in the layout.

TABLE B1

BUFFER CELLS

1. Row cells:
    a. Filler2, etc: particular ones as specified.
    b. Filler Tap and End-Tap cells: particular ones as specified.
    c. Filler_edecap: particular edecap cells as specified.
    d. Decap (for use when a top/bottom terminator cell also is placed as
        a row terminator cell).

TABLE B1-continued

BUFFER CELLS

2. Top/Bottom cells:
    a. Filler_edecap: particular edecap cells as specified.
    b. Decap
    c. Tap cells as in (1.b.) if directly above or below another tap cell from (1.b) or if placed at the end of a Top/Bottom row.

TABLE B2

BAD NEIGHBOR CELLS

1. Level shifter cells: particular level-in and level-out cells as specified.
2. Switch cells: particular ones as specified, and core ESD diode.
3. TGOX (thick gate dielectric) decap cells.
    a. Filler edecap: particular ones as specified.
    b. Core Decap.

TABLE B3

BASE LEVELS

Nwell
Dummy
ACTIVE areas
Poly
Ghost Poly*
Poly Filler
Dummy Poly^.

(*In some processes, ghost polysilicon or ghost poly gates may be formed and then removed to reduce dimension variations in the intended remaining circuit structures due to process variations and OPC differences such as across the interior cells to end cells.)
(^Some layouts use non-functional patterns of polysilicon called dummy poly, such as unconnected parallel poly lines to improve the regularity of the layout as a whole.)

TABLE B4

Cells with effective Filler1 at one end:
Particular ones as specified.

In the various embodiments of the present invention, a design process for implementing the methods described above can be implemented in a design tool including automatic error checking. Circuit design tools can include tools based on or distributed by Cadence™, Synopsys™, Mentor Graphics™, Magma Design Automation™, or otherwise.

Viewing each of FIGS. 1 and 3 as a whole, notice that the narrow cell block separations introduced by the layout processes taught herein involve very little extra layout area while offering significantly increased freedom from context effects and consequent improvements in performance, operational predictability, release-to-production time after initial design, and process yields of integrated circuit dice working as designed. As in FIGS. 1 and 3, integrated circuits that are especially likely to have relatively little area impact from the application of the layout processes herein are those that lay out in relatively contiguous, geometrically regular aligned areas of good neighbor cells and wells, and have a relatively modest set of compact areas of bad-neighbor cells and of non-P&R regions.

One or more types of metric for dependence on context effects or independence from context effects can be suitably established for purposes of the type of chip being laid out, to support the preparation of some of the embodiments.

One type of metric is percentage of maximum departure of timing from a specified timing value of a given type of timing parameter such as time interval or delay needed to go from one valid logic state to a next valid logic state, or some specified given type of settling time in the block, or otherwise.

Another type of metric is percentage of departure of saturation current Idsat from a value of Idsat for a standard cell deep within a row or column. The maximum percentage of departure depends on the timing constraints of the particular chip and is determined by the skilled worker. The row and column cell block terminators are established to have a sufficient number of alternating well patterns, alternating active patterns, and number of multiple poly lines to ensure that that Idsat departure percentage is constrained to be less than a specified maximum percentage value (e.g., one or two percent or other specified percentage).

A standard cell for the present purposes can be regarded as "deep within" a row or column by using a supporting metric called a space constant herein. For example, the DSL boundary effect approximately follows a decaying exponential. Put another way, a decaying exponential can reasonably be curve-fitted to usefully approximate such DSL boundary effect. One space constant is here defined to be the amount of space to a DSL boundary (or other applicable boundary) needed to cause the maximum percentage departure (such as occurs at some minimum spacing) to be reduced to 1/e (where e=~2.718, the base of natural logarithms). A standard cell can be regarded as "deep within" when space to DSL boundary is at least some specified number of space constants (e.g. two (2)). If the maximum DSL percentage departure cannot be readily measured or estimated, the space constant interval is alternatively measured from any point representing less than the maximum departure (due to proportional properties of the decaying exponential function). If even that alternative type of measurement is not available, then a spatial unit of length proportional to a space constant is defined arbitrarily as the spacing at which a percentage departure is some given value (e.g., 2%).

For layout purposes for a specific chip, cell block terminators with "long" alternating well patterns, adequate alternating active patterns, and sufficient numbers of poly lines are suitably understood as those that in combination that constrain the Idsat departure or timing departure in a boundary cell to be less than the maximum specified percentage departure for the chip or part of the chip being laid out. Other approaches for defining acceptable cell block terminator embodiments and layout region embodiments may also be used to support design process and manufacturing process embodiments.

Design rules can also be established as dimensional or numerical constraints to conveniently define the cell block terminators that will be regarded as permissible for laying out a particular chip or type of chip, even when the convenient definitions may leave some rigorously-analyzable, technologically-acceptable possibilities and embodiments outside the permission of such design rules.

To implement a particular desired integrated circuit that is designed and defined by a netlist of the functional electronic circuits, a form of computer software and system, called a layout tool or place-and-route tool or simply a tool, is used to situate and define the geometric arrangement of the transistors, conducting lines, contacts, vias and their interconnections with the semiconductor devices.

A process flow includes a step that electronically stores a list of qualified terminators. In a subsequent step, a place and route P&R software-driven computer is suitably used to place qualified terminators at the top and bottom of the block. In some design processes, the designer places them at right and left, and in other design process embodiment flows the P&R computerized embodiments place those as well. A post-design check is implemented that checks to ensure that only qualified terminators were placed.

The layout embodiments can be implemented in masks for contact, proximity, or projection photolithography processes. The masks can be designed to operate with any light source, including or such as G-line, H-line, or I-line resist processes. The masks can also be designed to be used with KrF and ArF laser resist processes. Furthermore, the masks can be designed to operate with DUV (deep ultraviolet), EUV (extreme ultraviolet), and X-ray resist processes.

The integrated structure can include various elements therein and/or layers thereon. These can include metal or other interconnect layers, barrier layers, dielectric layers, device structures, active elements and passive elements including word lines, source regions, drain regions, gates, bit lines, bases, emitters, collectors, conductive lines, conductive vias, etc. Moreover, instead of using the invention on a CMOS (complementary metal oxide semiconductor) structure as described above, the invention is applicable to other semiconductor technologies such as BiCMOS, bipolar, SOI (semiconductor on insulator), strained silicon, pyroelectric sensors, opto-electronic devices, organic transistors, single-gate and multiple-gate (MUGFET or FINFET) field effect transistors, microelectrical mechanical system (MEMS), and/or SiGe (silicon germanium). Photonic integrated circuit blocks, components, and interconnects are also suitably applied in various embodiments.

Figure 4:
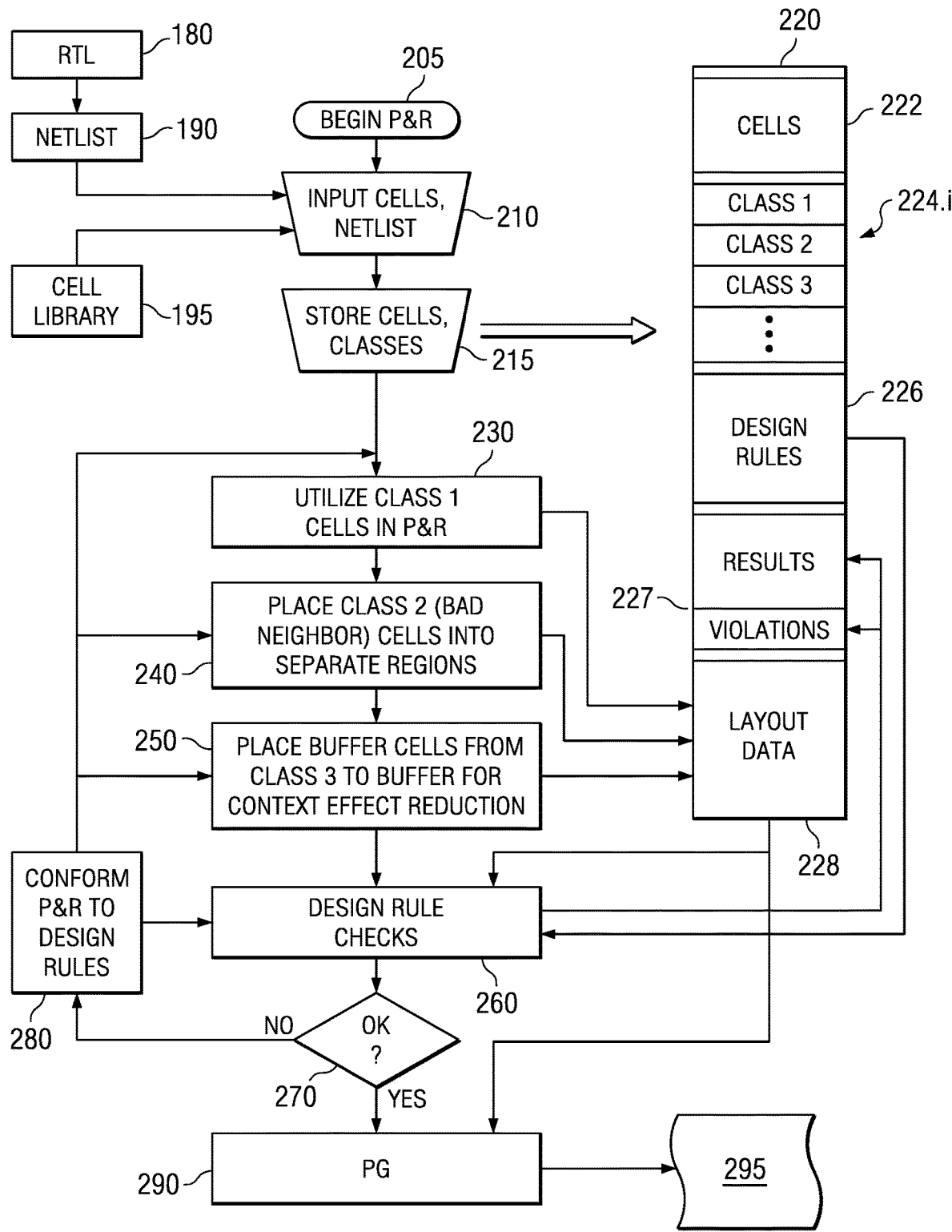
FIG. 4 is a flow diagram of a process embodiment for designing integrated circuits of FIGS. 1-3.

In FIG. 4, an electronic design process flow is used for automatically designing integrated circuits. A high-level hardware design language RTL is used in a workstation at which a designer prepares by step 180 a high-level functional description of the hardware. Then at step 190 the RTL is converted to a netlist that specifies the circuit components and their interconnections at the transistor level. Place and route operations commence with a BEGIN P&R 205 then proceed to a step 210 that inputs library 195 cells, if not already stored, and that step 210 obtains the netlist. Then a step 215 stores cells into a memory area 222 of a memory 220. The cells have cell names, IDs (identifications), or designators that are divided by step 215 into classes 224.*i* corresponding to the various supporting tables A1-A4 and B1-B4 described herein above. Generally speaking, these classes 224.*i* include a first class of cells that can be placed near other cells without disrupting their neighbor's behavior, and a second class of cells that disrupt their neighbor's timing beyond specified criteria, and a third class of buffer cells that cause little, if any, timing disruption and also themselves are insensitive to timing disruption. Storing these classes of cells is an example of storing classes in an automatically readable form with a first physical medium, e.g., memory 220.

Next a set of steps 230, 240, 250 sequentially or iteratively utilizes selections of cells in step 230 from the first class of cells in situating such cells near other such first class cells to realize at least part of the design, placing selections of cells in step 240 from the second class of cells into separate place and route regions, and in step 250 buffering at least some of the second class cells thus placed so that they are buffered for context effects reduction from the cells of the first-class. The buffering step 250 includes placing at least one cell from the third class of cells adjacent to at least one of the second-class cells to buffer such second-class cell from a first-class cell. Such third class cells include row buffer cells including filler, filler tap, end-tap, and decoupling capacitor (decap). The $3^{rd}$ class cells buffer standard cells in the first class from adverse context effects from cells in the second class that may include any one or more of a level shifter cell, a $3^{rd}$ class type switch cell, an electrostatic discharge (ESD) diode, and thick gate dielectric decap cell. Recall from description earlier hereinabove that cells in the first class are generally cells containing working transistors that produce a logic state output, switch cells, and non-working cells (ECO) that can potentially be connected to produce a logic state output.

In FIG. 4, the step 230 in more detail suitably includes automatic arrangement by the tool of the Class 1 cells into rows and columns in a manner implementing the netlist and providing spatial regularity of well structures and alignment of active regions and wells to conjoin them with each other to the extent possible under electronically stored design rules 226, corresponding to Rule Table A or B and as described hereinabove. As the rows and columns are completed, step 230 establishes the row and column terminators for them consistent with rules 226 using buffer cells from Class 3. Step 230 defines cell block separation strips or region separation strips consistent with protection boundaries of e.g. FIG. 2, such as where the design rules 226 specify protective separation between region boundaries of regions of conjoined Class 1 cells.

Further in FIG. 4, a step 260 performs design rule checks on the place and route database 228 resulting from operations so far by steps 230-250. The design rules are stored in a memory area 226 and include design rules of RULE TABLE A or B provided beforehand in an electronic program form suitable for execution by design rule check step 260 that also uses a memory area 227 for arrays of computational results and violations found. Then a step 270 determines whether any design rule violations have occurred, and if Not OK then operations go to a step 280 that makes corrections to the place and route database 228 and can go back to steps 230, 240, 250, 260 to ensure conformance with the design rules. When conformance has been obtained at step 280 as confirmed by steps 260 and 270, then operations proceed to a step 290 for pattern generation, e.g. of GDSII manufacturing information, in suitable format.

Figure 5:
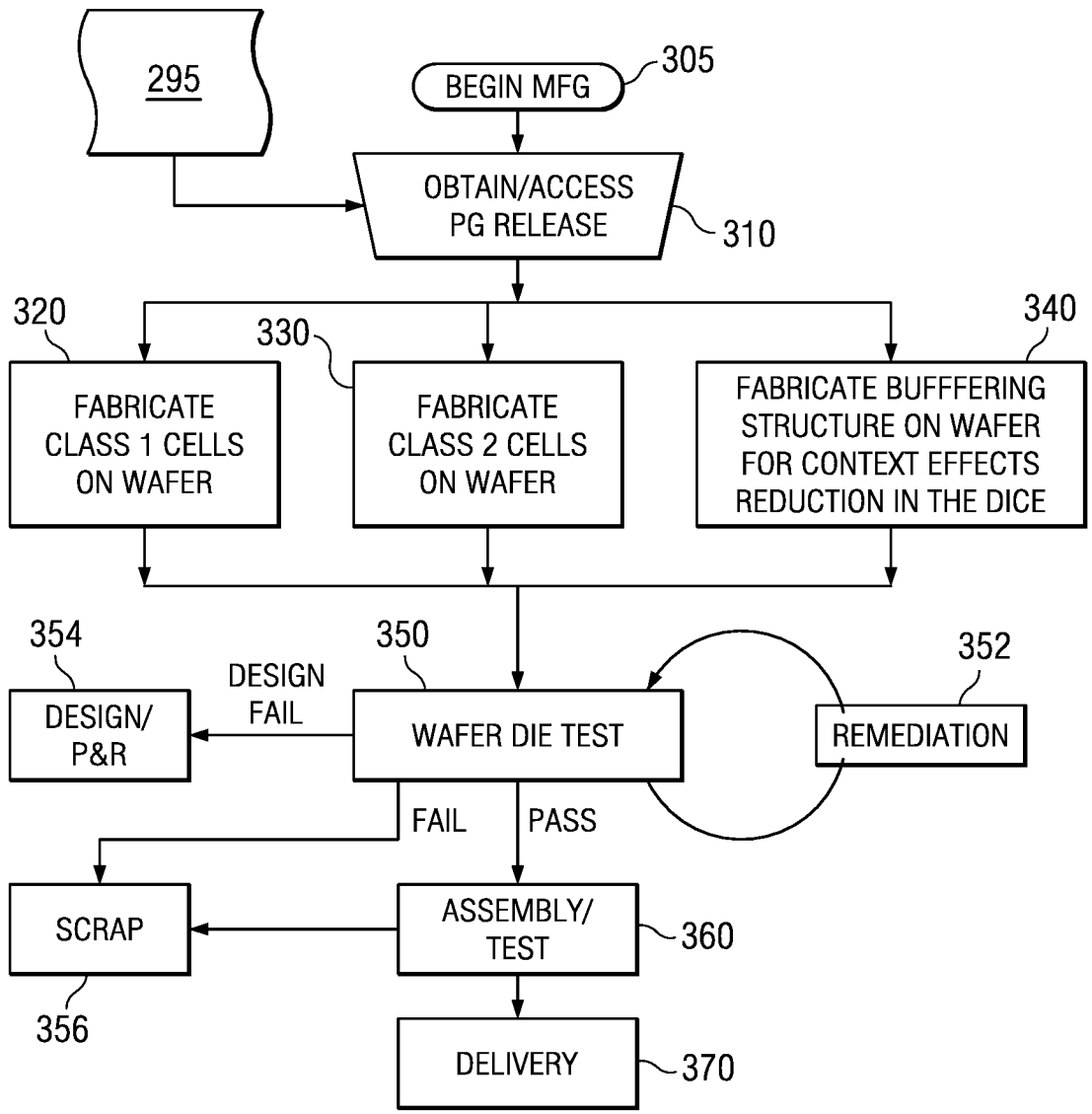
FIG. 5 is a flow diagram of a process embodiment for manufacturing integrated circuits of FIGS. 1-3 in response to pattern generation from the process of FIG. 4.

Pattern generation in step 290 of FIG. 4 takes the tool-generated place and route information 228 and formats into an output ready to control production of the target chip in a wafer manufacturing fabrication factory as in FIG. 5. In this way, the process is an example of electronically executing the utilizing, placing, and buffering steps to generate and store a pattern representing an integrated circuit layout to a second physical storage medium 295 such as a hard drive portion, flash drive or pattern generation tape or otherwise.

In FIG. 5, a process embodiment for manufacturing commences with a BEGIN 305 and then proceeds in a step 310 to access the PG release from step 290 to manufacturing. The PG database is accessed and used to control various wafer fab equipment units that perform implants, chemical vapor deposition CVD, plasma etch, wet etch, anneals, etc. For present purposes, the collective operation of these fab equipment units is controlled to achieve completion of approximately parallel or concurrent manufacturing process steps 320, 330, 340.

Step 320 of FIG. 5 fabricates first sets of cells from the first class of standard cells as described in connection with FIG. 4 including and near other such standard cells onto a semiconductor substrate 10 to realize at least part of circuitry for an integrated circuit. Step 330 of FIG. 5 concurrently fabricates second sets of cells from the second class of cells into regions separate relative to said first sets of cells broadside on the substrate 10, and in accordance with the overlap, non-overlap, and spacing-related design rules implemented, instantiated and realized in FIG. 4. Step 340 concurrently fabricates buffering structures for at least some of the first sets of cells so that they are buffered for context effects reduction from the cells of the second-class. As in FIG. 4, the cells in the first class are situated by neighboring cells in the first class without disrupting their neighbor's behavior, while a cell in the second class would disrupt a first class cell timing beyond specified criteria if it were situated adjacent and without protective measures taught herein. The buffering structures cause little, if any, timing disruption to an adjacent cell and also themselves are insensitive to timing disruption from such adjacent cell. The fabricating of buffering structures in step 340 situates at least one buffer cell adjacent to at least one of the first-class cells to buffer such first-class cell from a second-class cell.

In FIG. 5 after wafer fabrication, the manufacturing process proceeds to a wafer/die test step 350. Dice that pass test step 350 go to assembly/test step 360 for packaging and test, followed by delivery 370 of good packaged integrated circuit product. Some dice at step 350 may be sent to remediation 352 and further testing in step 350. Some other dice may be scrapped at step 356 (or 360) due to manufacturing reasons. Some dice may fail and indicate advisability of return at step 354 for re-layout in FIG. 4 steps 205-295 or design corrections in steps 180 or 190 beforehand.

Figure 6:
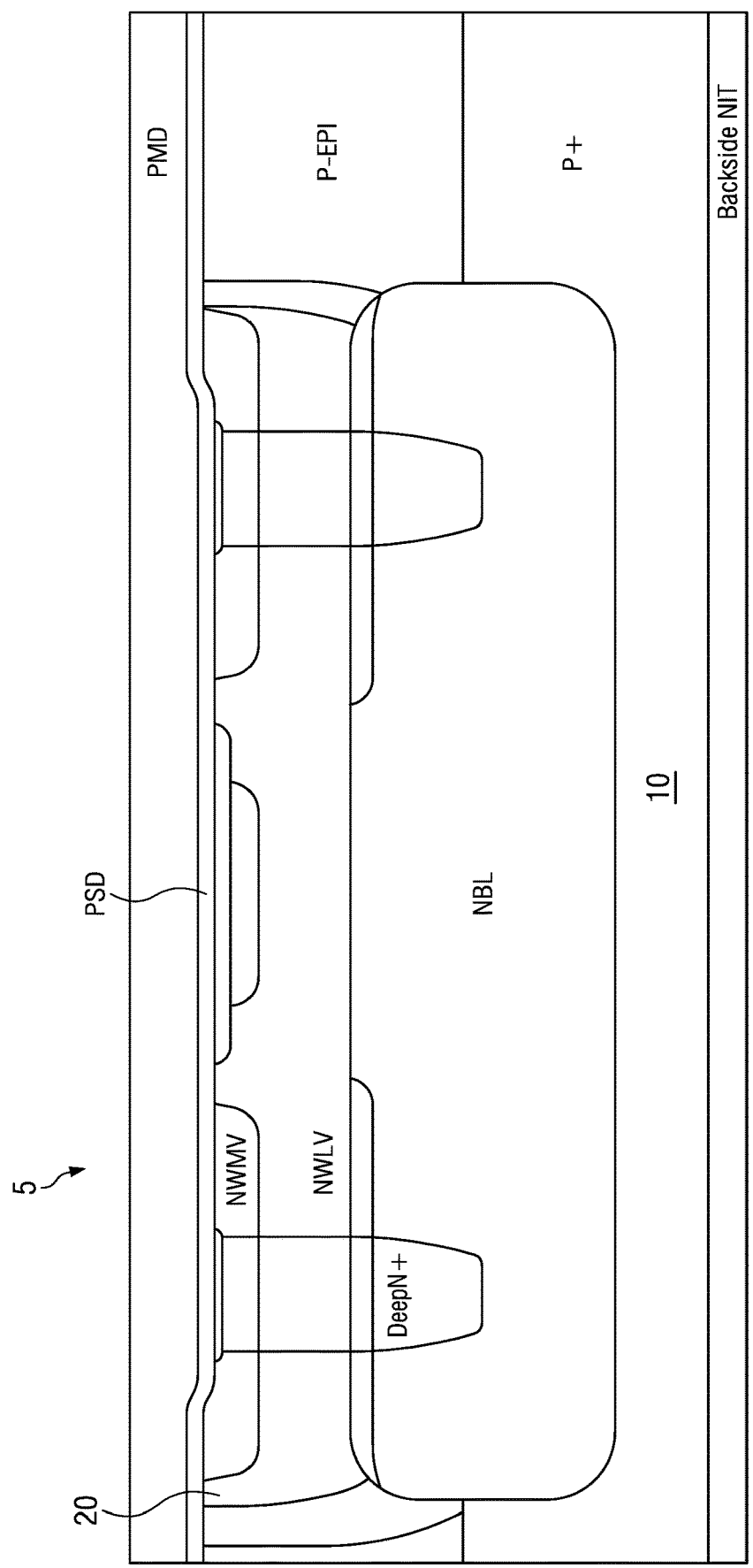
FIG. 6 is a cross-section of a substrate showing some structures that can be associated with a single transistor in FIG. 6 for numerously constituting a larger cell.

In FIG. 6, the structure and process flow and example shown is part of an extensive process that, e.g., patterns and implants N-type buried layers NBL Implant into a P+ substrate 10, and then overlays it with a P-epitaxial layer by P-EPI Deposition. Proceeding as illustrated in FIG. 6, Well Pad Oxidation is followed by NWell Implant NWLV, NWMV and N+ Diffusion. The originally-extensive P-epitaxial layer is almost replaced by other structures such as Wells and PSD formed by NWell and PSD source/drain implant and diffusion Then PMD dielectric is patterned and implanted. Gate oxide formation and e.g. Poly gate fabrication, contact deposition, interconnect, ILD, and higher metal layers and dielectric are further parts of IC manufacture.

Figure 7:
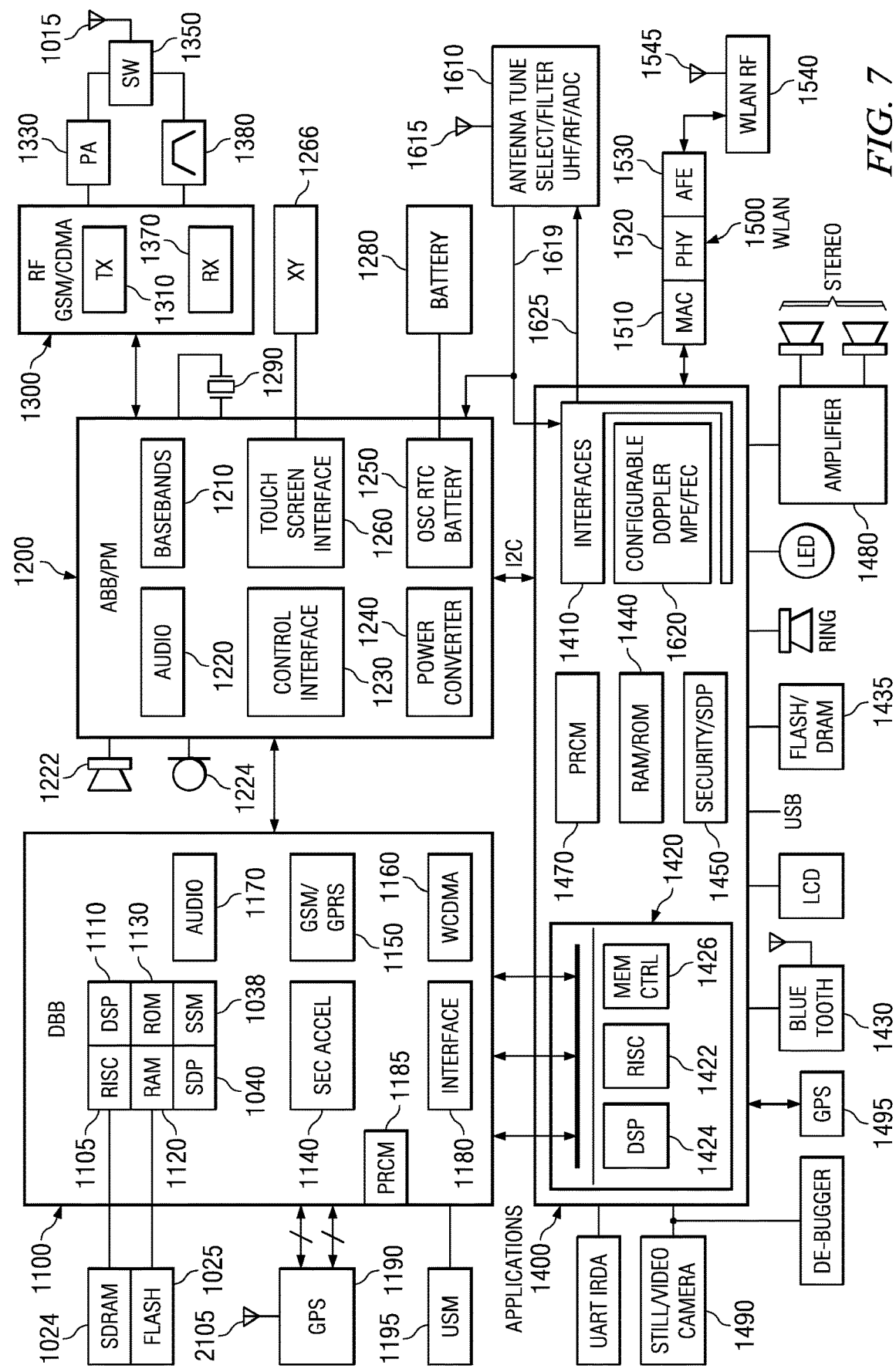
FIG. 7 is a block diagram of a system or system-on-chip (SOC) embodiment including improvements in the other Figures.

Various embodiments of the other Figures herein are employed in chip embodiments and in system embodiments of FIG. 7, such as from Published U.S. Patent Application 20090168843 dated Jul. 2, 2009, (TI-65435 of Texas Instruments Incorporated), all of which is hereby incorporated herein by reference. The chips are laid out by place-and-route according to the teachings and other Figures herein.

It is contemplated that the skilled worker uses each of the integrated circuits shown in FIG. 7, or such selection from the complement of blocks therein provided into appropriate other integrated circuit chips, or provided into one single integrated circuit chip, in a manner optimally combined or partitioned between the chips, to the extent needed by any of the applications supported by a DVB station, cellular telephone base station, a personal computer(s) equipped with WLAN, WLAN access point and Voice WLAN gateway, as well as cellular telephones, radios and televisions, Internet audio/video content players, fixed and portable entertainment units, video phones, routers, pagers, personal digital assistants (PDA), organizers, scanners, faxes, copiers, household appliances, office appliances, microcontrollers coupled to controlled mechanisms for fixed, mobile, personal, robotic and/or automotive use, combinations thereof, and other application products now known or hereafter devised for increased, partitioned or selectively determinable advantages.

In FIG. 7, an integrated circuit 1100 includes a digital baseband (DBB) block that has a RISC processor 1105 (such as MIPS core(s), ARM core(s), or other suitable processor) and a digital signal processor 1110 such as from the TMS320C55x™ DSP generation from Texas Instruments Incorporated or other digital signal processor (or DSP core) 1110, communications software and security software for any such processor or core, security accelerators 1140, and a memory controller. A power resets and control module PRCM 1185 provides power management circuitry for chip 1100. Chip 1100 is coupled to location-determining circuitry 1190 satellite positioning such as GPS (Global Positioning System).

In FIG. 7, a mixed-signal integrated circuit 1200 includes an analog baseband (ABB) block, SPI (Serial Port Interface), digital-to-analog/analog-to-digital conversion DAC/ADC block, a power conversion block and RF (radio frequency) Control, and coupled to RF chip 1300.

Further in FIG. 7, an integrated circuit chip or core 1400 is provided for applications processing and more off-chip peripherals. This type of SOC (system on chip or chips) is especially suitable for inclusion of embodiments taught herein for advanced process node manufacture with embodiments of process and structure taught herein, among many other IC types of applications for the embodiments. Chip (or core) 1400 has interface circuit 1410 including a high-speed WLAN 802.11a/b/g interface coupled to a WLAN chip 1500. Further provided on chip 1400 is an applications processing section 1420 which includes a RISC processor 1422 (such as MIPS core(s), ARM core(s), or other suitable processor), a digital signal processor (DSP) 1424 such as from the TMS320C55x™ DSP generation and/or the TMS320C6x™ DSP generation from Texas Instruments Incorporated or other digital signal processor(s), and a shared memory controller MEM CTRL 1426 with DMA (direct memory access), and a 2D (two-dimensional display) graphic accelerator. Speech/voice codec/speech recognition functionality is suitably processed in chip 1400, in chip 1100, or both chips 1400 and 1100. The RISC processor 1422 and the DSP 1424 in section 1420 have access via an on-chip extended memory interface (EMIF/CF) to off-chip memory resources 1435 including as appropriate, mobile DDR (double data rate) DRAM, and flash memory of any of NAND Flash, NOR Flash, and Compact Flash. A shared memory controller 1426 in circuitry 1420 interfaces the RISC processor 1420 and the DSP 1424 via an on-chip bus to on-chip memory 1440 with RAM and ROM. A 2D graphic accelerator is coupled to frame buffer internal SRAM (static random access memory) in block 1440. A security block 1450 includes secure hardware accelerators. On-chip peripherals and additional interfaces 1410 include UART data interface and MCSI (Multi-Channel Serial Interface) voice wireless interface for an off-chip IEEE 802.15 (Bluetooth and low and high rate piconet and personal network communications) wireless circuit 1430. Debug messaging and serial interfacing are also available through the UART. A JTAG emulation interface couples to an off-chip emulator Debugger for test and debug. GPS 1190 (1495) is scannable by the debugger. Further in peripherals 1410 are an I2C interface to analog baseband ABB chip 1200, and an interface to applications interface 1180 of integrated circuit chip 1100 having digital baseband DBB. Timers, interrupt controller, and RTC (real time clock) circuitry are provided in chip 1400. Further in peripherals 1410 are a MicroWire (u-wire 4 channel serial port) and multi-channel buffered serial port (McBSP) to Audio codec, a touch-screen controller (or coupling to 1260), and audio amplifier 1480 to stereo speakers.

An on-chip UART/IrDA (infrared data) interface in interfaces 1410 couples to off-chip GPS (global positioning system of block 1495 cooperating with or instead of GPS 1190) and Fast IrDA infrared wireless communications device. An interface provides EMT9 and Camera interfacing to one or more off-chip still cameras or video cameras 1490. An on-chip LCD controller or DLP™ controller and associated PWL (Pulse-Width Light) block in interfaces 1410 are coupled to a color LCD display off-chip and/or DLP™ digital light processor display.

On chip 1400, a power, resets, and control module PRCM 1470 supervises and controls power consuming blocks and sequences them, and coordinates with PRCM 1185 on chip 1100 and with a Power Save Mode Controller 2130 (2290) in GPS 1495.

In FIG. 7, an 802.11 WLAN or 802.16 WiMax wireless networking integrated circuit 1500 includes MAC (media access controller) 1510, PHY (physical layer) 1520 and AFE (analog front end) 1530 for use in various WLAN and UMA (Unlicensed Mobile Access) modem applications. Interface hardware and internal RAM in WLAN 1500 couples the CPU with interface 1410 of applications processor integrated circuit 1400 thereby providing an additional wireless interface for the system of FIG. 7. In some embodiments, GPS 1495 operates in close coordination with any one, some, or all of WLAN, WiMax, DVB, or other network, to provide positioning, position-based, and user real-time kinematics applications.

ASPECTS (see notes at end of this Aspects section). Some notable aspects are listed as follows for providing further perspectives on various embodiments and categories thereof:

23A. The electronic design process claimed in claim 23 wherein the third class of cells thus stored includes at least one type of capacitor cell.

31A. The process of manufacturing claimed in claim 31 wherein the buffering structure includes at least one type of capacitor cell.

Notes about Aspects above: Aspects are paragraphs of description which might be offered as claims in patent prosecution. The above dependently-written Aspects have leading digits and internal dependency designations to indicate the claims or aspects to which they pertain. Aspects having no internal dependency designations have leading digits and alphanumerics to indicate the position in the ordering of claims at which they might be situated if offered as claims in prosecution.

Processing circuitry comprehends digital, analog and mixed signal (digital/analog) integrated circuits, ASIC circuits, PALs, PLAs, decoders, memories, and programmable and nonprogrammable processors, microcontrollers and other circuitry. Internal and external couplings and connections can be ohmic, capacitive, inductive, photonic, and direct or indirect via intervening circuits or otherwise as desirable. Process diagrams herein are representative of flow diagrams for operations of any embodiments using any one, some or all of hardware, software, or firmware, and processes of manufacture thereof. Flow diagrams and block diagrams are each interpretable as representing structure and/or process. While this invention has been described with reference to illustrative embodiments, this description is not to be construed in a limiting sense. Various modifications and combinations of the illustrative embodiments, as well as other embodiments of the invention may be made. The terms including, includes, having, has, with, or variants thereof are used in the detailed description and/or the claims to denote non-exhaustive inclusion in a manner similar to the term comprising.

While this invention has been described according to some exemplary embodiments, it contemplated that still other modifications of, and alternatives to, these embodiments, such modifications and alternatives obtaining the advantages and benefits of this invention, will be apparent to those of ordinary skill in the art having reference to this application specification and its drawings.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An electronic design process of designing integrated circuits, the process comprising:
    dividing cells into classes including a first class of cells susceptible to context effects and a second class of cells that cause context effects in cells sensitive to timing disruption if placed proximate the first class of cells;
    placing, in a first place and route region, cells that are included in the first class of cells adjacent other cells in the first class;
    removing from the first place and route region any cells from the second class of cells;
    placing cells from the second class of cells into a second place and route region nonadjacent to the first place and route region; and
    buffering at least some of the second class cells thus placed so that they are buffered for context effects reduction from the cells of the first class, wherein the buffering includes providing a cell-block separation strip having a minimum width of at least eight track widths.

2. The process of claim 1, including storing a representation of the design rules and the placement of cells in an automatically readable form with a first physical medium, and electronically executing the placing and buffering steps to generate and store a pattern representing an integrated circuit layout to a second physical medium.

3. The electronic design process of claim 1, wherein the storing includes storing a third class of cells that do not cause timing disruption and are insensitive to timing disruption, and wherein the buffering includes placing at least one cell from the third class of cells adjacent to at least one of the second-class cells to buffer the second-class cell from a first-class cell.

4. The process of claim 3, wherein the third class cells include row buffer cells selected from a group consisting of: 1) filler, 2) filler tap, 3) end-tap, and 4) decoupling capacitor.

5. The process of claim 3 wherein the third class cells include column buffer cells including decoupling capacitor and also includes a tap cell situated directly above or below a row buffer tap cell.

6. The process of claim 1, wherein the buffering includes providing a set of filler cells adjacent to at least one of the first-class cells and with the cell block separation strip along the set of filler cells and separating the set of filler cells from at least one of the cells from the second class of cells.

7. The process of claim 1, wherein the buffering includes providing a set of filler cells adjacent to a first selection of the first-class cells and with the cell-block separation strip along the set of filler cells and separating the set of filler cells from at least one other selection of first class cells that is offset from alignment with the first selection of first-class cells.

8. The process of claim 7, wherein the buffering includes providing a second set of filler cells adjacent to said at least one other selection of first-class cells and with the cell-block separation strip along said second set of filler cells and separating the second set of filler cells from the first set of filler cells.

9. The process of claim 1, wherein the cells in the second class include at least one level shifter cell, switch cell, electrostatic discharge (ESD) diode, and thick gate dielectric decoupling capacitor cell.

10. The process of claim 1, wherein the cells in the first class are restricted to cells containing working transistors that produce a logic state output, switch cells, and non-working cells that can potentially be connected to produce a logic state output.

11. A process of manufacturing integrated circuits, the process comprising:

fabricating first sets of cells from a first class of standard cells onto a semiconductor substrate to realize at least part of the circuitry for an integrated circuit;

fabricating, concurrently with fabrication of the first sets of cells, second sets of cells from a second class of cells into regions nonadjacent to the first sets of cells on the substrate; and fabricating, concurrently with fabrication of the first and second sets of cells, buffering structures having a minimum width of at least eight track widths that reduce context effects in at least some of the first sets of cells from the cells of the second class.

12. The process of claim 11, wherein a first group of cells in the first class are placed adjacent a second group of cells in the first class.

13. The process of claim 11, wherein the buffering structures do not cause timing disruption to an adjacent cell and are insensitive to timing disruption from such adjacent cell.

14. The process of claim 11, wherein the fabricating of buffering structures situates at least one buffer cell adjacent to at least one of the first-class cells to buffer the first-class cell from a second-class cell.

\* \* \* \* \*